United States Patent
Nakayama et al.

(10) Patent No.: US 7,459,788 B2
(45) Date of Patent: Dec. 2, 2008

(54) OHMIC ELECTRODE STRUCTURE OF NITRIDE SEMICONDUCTOR DEVICE

(75) Inventors: Tatsuo Nakayama, Tokyo (JP); Yuji Ando, Tokyo (JP); Hironobu Miyamoto, Tokyo (JP); Masaaki Kuzuhara, Tokyo (JP); Yasuhiro Okamoto, Tokyo (JP); Takashi Inoue, Tokyo (JP); Koji Hataya, Tokyo (JP)

(73) Assignee: NEC Corporation, Tokyo (JP)

( * ) Notice: Subject to any disclaimer, the term of this patent is extended or adjusted under 35 U.S.C. 154(b) by 1 day.

(21) Appl. No.: 10/590,730

(22) PCT Filed: Feb. 28, 2005

(86) PCT No.: PCT/JP2005/003802

§ 371 (c)(1),
(2), (4) Date: Mar. 15, 2007

(87) PCT Pub. No.: WO2005/083761

PCT Pub. Date: Sep. 9, 2005

(65) Prior Publication Data

US 2007/0164305 A1  Jul. 19, 2007

(30) Foreign Application Priority Data

Feb. 26, 2004 (JP) .............................. 2004-050798

(51) Int. Cl.
*H01L 23/48* (2006.01)
*H01L 23/52* (2006.01)
*H01L 29/40* (2006.01)

(52) U.S. Cl. ............... 257/761; 257/751; 257/763; 257/764; 257/770; 257/E23.041

(58) Field of Classification Search ................ 257/751, 257/761, 763, 764, 770, E23.041
See application file for complete search history.

(56) References Cited

U.S. PATENT DOCUMENTS

| | | | |
|---|---|---|---|
| 6,475,889 B1 * | 11/2002 | Ring ........................... | 438/571 |
| 6,825,566 B1 * | 11/2004 | Sakata et al. ................. | 257/774 |
| 6,828,233 B2 * | 12/2004 | Leiphart ...................... | 438/656 |
| 6,835,649 B2 * | 12/2004 | Lee et al. ..................... | 438/629 |
| 2004/0026701 A1 * | 2/2004 | Murai et al. .................. | 257/79 |

FOREIGN PATENT DOCUMENTS

| | | |
|---|---|---|
| JP | 7-45867 | 2/1995 |
| JP | 2003-77862 | 3/2003 |
| JP | 2003-86533 | 3/2003 |
| JP | 2003-530716 | 10/2003 |

\* cited by examiner

*Primary Examiner*—Ngan Ngo
(74) *Attorney, Agent, or Firm*—Young & Thompson

(57) ABSTRACT

An ohmic electrode structure of a nitride semiconductor device having a nitride semiconductor. The ohmic electrode structure is provided with a first metal film formed on the nitride semiconductor and a second metal film formed on the first metal film. The first metal film is composed of at least one material selected from a group consisting of V, Mo, Ti, Nb, W, Fe, Hf, Re, Ta and Zr. The second metal film is composed of at least one material different from that of the first metal film (102), selected from a group consisting of V, Mo, Ti, Nb, W, Fe, Hf, Re, Ta, Zr, Pt and Au.

6 Claims, 1 Drawing Sheet

OHMIC ELECTRODE STRUCTURE OF NITRIDE SEMICONDUCTOR DEVICE

TECHNICAL FIELD

This invention relates to an ohmic electrode structure of a nitride semiconductor device and, in particular, relates to an ohmic electrode structure of a nitride semiconductor device that can be used in a device using a nitride semiconductor, such as, for example, a light-emitting diode, a laser diode, a Schottky diode, a field-effect transistor, or a bipolar transistor.

BACKGROUND ART

As shown in Japanese Unexamined Patent Publication No. Hei 7-45867 (hereinafter referred to as Patent Document 1), Ti/Al is used as an ohmic electrode material in a conventional AlGaN/GaN HJFET structure. By using Al as the electrode material in this manner, the contact resistance with a nitride semiconductor at room temperature becomes low.

DISCLOSURE OF THE INVENTION

However, when Al is used as the electrode material, the melting point of Al is as low as 660° C., Al tends to react with oxygen in the atmosphere, and Al has a high reactivity and tends to form a eutectic alloy with another metal. From these reasons, there has been a problem that the surface shape changes during high-temperature operation or high-temperature storage.

Further, there has been a problem that the time-dependent change in contact resistance is large and, therefore, even if a low contact resistance is obtained at room temperature, the contact resistance deteriorates with time during operation.

Moreover, for example, in the foregoing Patent Document 1, reactions of Al and Ti slowly proceed from low temperatures near 300° C. Accordingly, there has been a problem that the electrode gradually changes during high-temperature operation so that the contact resistance is degraded.

Therefore, this invention has been made in view of the foregoing prior art problems and has an object to provide an ohmic electrode of a nitride semiconductor device that can withstand high-temperature storage and is free from degradation in contact resistance even during operation.

MEANS FOR SOLVING THE PROBLEM

According to a first aspect of this invention, an ohmic electrode structure of a nitride semiconductor device having a nitride semiconductor comprises a first metal film formed on the nitride semiconductor, and a second metal film formed on the first metal film, wherein the first metal film is made of at least one material selected from the group consisting of V, Mo, Ti, Nb, W, Fe, Hf, Re, Ta, and Zr, and the second metal film is made of at least one material that is different from that of the first metal film and selected from the group consisting of V, Mo, Ti, Nb, W, Fe, Hf, Re, Ta, Zr, Pt, and Au.

It is preferable that the nitride semiconductor be a semiconductor containing GaN, AlN, InN, and their mixture as main components.

It is preferable that a Si layer be formed between the first metal film and the nitride semiconductor. This Si layer serves as an n-type dopant with respect to the nitride semiconductor.

Further, according to a second aspect of this invention, an ohmic electrode structure of a nitride semiconductor device having a nitride semiconductor comprises a first metal film formed on the nitride semiconductor, a second metal film formed on the first metal film, and a third metal film formed on the second metal film, wherein the first metal film is made of at least one material selected from the group consisting of V, Mo, Ti, Nb, W, Fe, Hf, Re, Ta, and Zr, the second metal film is made of at least one material that is different from that of the first metal film and selected from the group consisting of V, Mo, Ti, Nb, W, Fe, Hf, Re, Ta, Zr, Pt, and Au, and the third metal film is made of at least one material that is different from that of the second metal film and selected from the group consisting of V, Mo, Ti, Nb, W, Fe, Hf, Re, Ta, Zr, Pt, and Au.

It is preferable that the nitride semiconductor be a semiconductor containing GaN, AlN, InN, and their mixture as main components.

It is preferable that a Si layer be formed between the first metal film and the nitride semiconductor. This Si layer serves as an n-type dopant with respect to the nitride semiconductor.

An ohmic electrode of a nitride semiconductor device of this invention is made of a metal, as a main component, having a melting point equal to or higher than a melting point of Au. Therefore, the surface shape does not easily change during high-temperature operation or high-temperature storage. The reactions of Al and Ti slowly proceed from low temperatures near 300° C., while, in the electrode structure of this invention, since Al having a low melting point is not used, alloying is reluctant to proceed, thus being stable. Accordingly, an ohmic electrode that can maintain a low contact resistance even during high-temperature operation can be obtained. By using the electrode structure that is stable even at high temperatures as described above, even if the temperature around the electrode rises through actual energization, the low contact resistance can be maintained to realize excellent devise properties. Particularly in the case of a high-output devise, since the devise temperature becomes high, the effect is remarkable.

BEST MODE FOR CARRYING OUT THE INVENTION

Embodiments of this invention will be described with reference to the drawings.

First Embodiment

Figure 1:
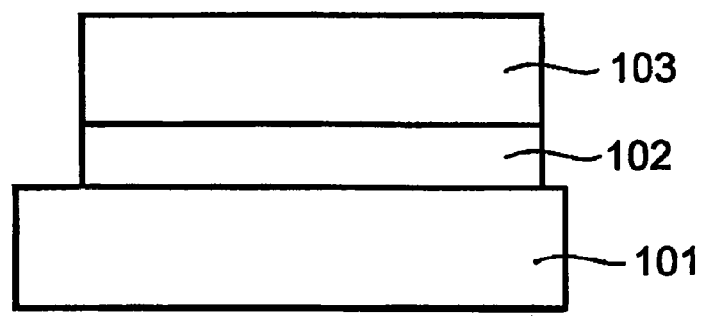
FIG. 1 is a sectional structural view showing an ohmic electrode according to a first embodiment of this invention.

The first embodiment of this invention is shown in FIG. 1. FIG. 1 is a sectional structural view showing an ohmic electrode according to the first embodiment of this invention.

The ohmic electrode of this invention is such that a first metal film 102 and a second metal film 103 are formed in order on a nitride semiconductor 101 such as a GaN-based semiconductor. Thereafter, heat treatment is carried out at 500° C. or more. In this manner, the ohmic electrode is formed.

The nitride semiconductor 101 of this embodiment is, for example, a semiconductor containing GaN, AlN, InN, and their mixture as main components.

The first metal film 102 is, for example, a metal film containing one of V, Mo, Ti, Nb, W, Fe, Hf, Re, Ta, and Zr.

The second metal film 103 is, for example, a metal film containing one of V, Mo, Ti, Nb, W, Fe, Hf, Re, Ta, Zr, Pt, and Au, which differs from that of the first metal film 102.

EXAMPLE 1

Description will be made of an Example of the first embodiment of this invention.

An ohmic electrode of this invention uses AlGaN (e.g. Al composition ratio 0.3) as a nitride semiconductor 101. Then, a Nb layer (e.g. film thickness 30 nm) as a first metal film 102 and an Au layer (e.g. film thickness 200 nm) as a second metal film 103 are sputter-deposited and heat treatment at 1000° C. is carried out. In this manner, the ohmic electrode is produced With this electrode structure, since the melting point of Nb is extremely high as 2477° C. and the melting point of Au is also high as 1064° C., no melting occurs at the heat treatment temperature. Further, alloying is difficult to proceed, thus being stable. Accordingly, it is possible to realize a low contact resistance of 3 Ωmm or less even if the temperature near the electrode rises to 500° C. during energization.

Although Nb is used as the first metal film 102 in this Example, the first metal film 102 may be a metal film containing one of V, Mo, Ti, W, Fe, Hf, Re, Ta, and Zr, or Si and N may be mixed. However, since there is a metal whose melting point is lowered depending on the mixing ratio of Si, it is preferable that the mixing ratio of Si be set to a value that causes the melting point of an alloy to be 1000° C. or more.

Further, although Nb is used as the second metal film 103, it is possible to use therefor a metal film containing one of V, Mo, Ti, Nb, W, Fe, Hf, Re, Ta, Zr, Pt, and Au, which differs from that of the first metal film 102.

Table 1 shows the first metals with one example of their thickness and the second metals with one example of their thickness, which are applicable in Example 1. Further, the melting points of the respective metals are shown under atomic symbols.

TABLE 1

| First Metal | Thickness (nm) | Second Metal | Thickness (nm) |
|---|---|---|---|
| V<br>1915° C. | 30 | V<br>1915° C. | 200 |
| Mo<br>2620° C. | 30 | Mo<br>2620° C. | 200 |
| Nb<br>2458° C. | 30 | Nb<br>2458° C. | 200 |
| Ti<br>1667° C. | 30 | Ti<br>1667° C. | 200 |
| W<br>3407° C. | 30 | W<br>3407° C. | 200 |
| Fe<br>1535° C. | 30 | Fe<br>1535° C. | 200 |
| Hf<br>2222° C. | 30 | Hf<br>2222° C. | 200 |
| Re<br>3180° C. | 30 | Re<br>3180° C. | 200 |
| Ta<br>2980° C. | 30 | Ta<br>2980° C. | 200 |
| Zr<br>1857° C. | 30 | Zr<br>1857° C. | 200 |
|  |  | Au<br>1064° C. | 200 |
|  |  | Pt<br>1769° C. | 200 |

In this Example, the thickness of the Nb layer as the first metal film 102 is set to 30 nm and the thickness of the Au layer as the second metal film 103 is set to 200 nm. However, the thicknesses of the Nb layer and the Au layer can be set to desired values. However, in order to prevent Au from directly contacting the semiconductor due to the influence of roughness of the metal interface, the thickness of the first metal film 202 (e.g. the Nb layer) is preferably 10 nm or more.

In this Example, the first and second metal films 102 and 103 are formed by sputter deposition. However, it is also possible to stack them in layers by another method such as electron-gun deposition.

Further, in this Example, the heat treatment temperature is set to 1000° C. However, the heat treatment temperature can be set to a desired value depending upon a metal to be used. Nevertheless, since the contact resistance tends to decrease as the heat treatment temperature rises, it is preferable to carry out the heat treatment at 800° C. or more. When further stacking a layer after the heat treatment, a desired metal can be formed to a desired thickness depending on the purpose.

Second Embodiment

Figure 2:
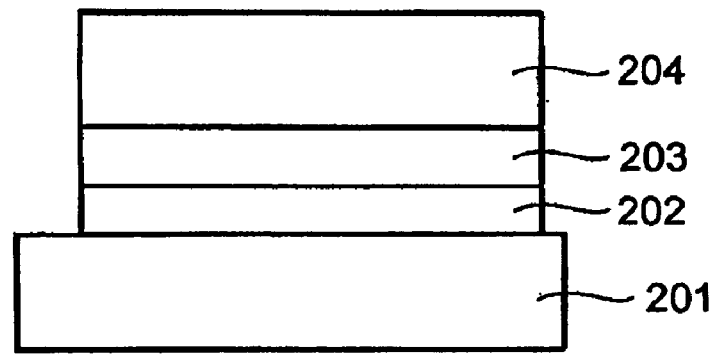
FIG. 2 is a sectional structural view showing an ohmic electrode according to a second embodiment of this invention.

The second embodiment of this invention is shown in FIG. 2.

FIG. 2 is a sectional structural view showing an ohmic electrode according to the second embodiment of this invention.

The ohmic electrode of this invention is such that a first metal film 202, a second metal film 203, and a third metal film 204 are formed in order on a nitride semiconductor 201 such as a GaN-based semiconductor. Thereafter, heat treatment is carried out at 500° C. or more. In this manner, the ohmic electrode is formed.

The nitride semiconductor 201 of this embodiment is, for example, a semiconductor containing GaN, AlN, InN, and their mixture as main components.

The first metal film 202 is, for example, a metal film containing one of V, Mo, Ti, Nb, W, Fe, Hf, Re, Ta, and Zr.

The second metal film 203 is, for example, a metal film containing one of V, Mo, Ti, Nb, W, Fe, Hf, Re, Ta, Zr, Pt, and Au, which differs from that of the first metal film 202.

The third metal film 204 is, for example, a metal film containing one of V, Mo, Ti, Nb, W, Fe, Hf, Re, Ta, Zr, Pt, and Au, which differs from that of the second metal film 203.

EXAMPLE 2

Description will be made of an Example of the embodiment of this invention.

An ohmic electrode of this invention uses AlGaN (e.g. Al composition ratio 0.3) as a nitride semiconductor 201. Then, a Nb layer (e.g. film thickness 30 nm) as a first metal film 202, a Pt layer (e.g. film thickness 35 nm) as a second metal film 203, and an Au layer (e.g. film thickness 200 nm) as a third metal film 204 are sputter-deposited and heat treatment at 1000° C. is carried out. In this manner, the ohmic electrode is produced.

With this electrode structure, since the melting point of Nb is 2477° C., the melting point of Pt is 1768° C., which are extremely high, and the melting point of Au is also high as 1064° C., no melting occurs at the heat treatment temperature. Further, since Pt is sandwiched between Nb and Au, alloying is more reluctant to proceed, thus being stable. Accordingly, it is possible to realize a low contact resistance of 3 Ωmm or less even if the temperature near the electrode rises to 500° C. during energization.

Although Nb is used as the first metal film 202 in this Example, use may be made, as the first metal film 202, of a metal film containing one of V, Mo, Ti, W, Fe, Hf, Re, Ta, and Zr, or Si and N may be mixed. However, since there is a metal whose melting point is lowered depending on the mixing ratio of Si, it is preferable that the mixing ratio of Si be set to a value that causes the melting point of an alloy to be 1000° C. or more.

Further, although Pt is used as the second metal film 203 in this Example, it is possible to use therefor a metal film containing one of V, Mo, Ti, Nb, W, Fe, Hf, Re, Ta, Zr, Pt, and Au, which differs from that of the first metal film 202.

Further, although Au is used as the third metal film 204, it is possible to use therefor a metal film containing one of V, Mo, Ti, Nb, W, Fe, Hf, Re, Ta, Zr, Pt, and Au, which differs from that of the second metal film 203.

Table 2 shows the first metals with one example of their thickness, the second metals with one example of their thickness, and the third metals with one example of their thickness, which are applicable in Example 2. Further, the melting points of the respective metals are shown under atomic symbols.

TABLE 2

| First Metal | Thickness (nm) | Second Metal | Thickness (nm) | Third Metal | Thickness (nm) |
| --- | --- | --- | --- | --- | --- |
| V 1915° C. | 30 | V 1915° C. | 35 | V 1915° C. | 200 |
| Mo 2620° C. | 30 | Mo 2620° C. | 35 | Mo 2620° C. | 200 |
| Nb 2458° C. | 30 | Nb 2458° C. | 35 | Nb 2458° C. | 200 |
| Ti 1667° C. | 30 | Ti 1667° C. | 35 | Ti 1667° C. | 200 |
| W 3407° C. | 30 | W 3407° C. | 35 | W 3407° C. | 200 |
| Fe 1535° C. | 30 | Fe 1535° C. | 35 | Fe 1535° C. | 200 |
| Hf 2222° C. | 30 | Hf 2222° C. | 35 | Hf 2222° C. | 200 |
| Re 3180° C. | 30 | Re 3180° C. | 35 | Re 3180° C. | 200 |
| Ta 2980° C. | 30 | Ta 2980° C. | 35 | Ta 2980° C. | 200 |
| Zr 1857° C. | 30 | Zr 1857° C. | 35 | Zr 1857° C. | 200 |
|  |  | Au 1064° C. | 35 | Au 1064° C. | 200 |
|  |  | Pt 1769° C. | 35 | Pt 1769° C. | 200 |

In this Example, the thickness of the Nb layer as the first metal film 202 is set to 30 nm, the thickness of the Pt layer as the second metal film 203 is set to 35 nm, and the thickness of the Au layer as the third metal film 204 is set to 200 nm. However, the thicknesses of the Nb layer, the Pt layer, and the Au layer can be set to desired values. However, in order to prevent Au from directly contacting the semiconductor due to the influence of roughness of the metal interfaces, the thickness of the second metal film 203 (e.g. the Pt layer) is preferably 10 nm or more. Further, the thickness of the first metal film 202 contacting the semiconductor surface may be suitably set to a value greater than 3 to 5 nm which is capable of covering the semiconductor surface.

In this Example, the first, second, and third metal films 202, 203, and 204 are formed by sputter deposition. However, it is also possible to stack them in layers by another method such as electron-gun deposition.

Further, in this Example, the heat treatment temperature is set to 1000° C. However, the heat treatment temperature can be set to a desired value depending upon a metal to be used. Nevertheless, since the contact resistance tends to decrease as the heat treatment temperature rises, it is preferable to carry out the heat treatment at 800° C. or more.

When further stacking a layer after the heat treatment, a desired metal can be formed to a desired thickness depending on the purpose.

Third Embodiment

Figure 3:
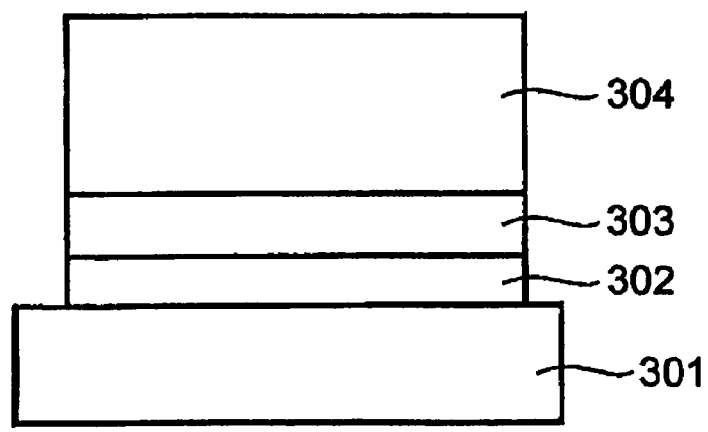
FIG. 3 is a sectional structural view showing an ohmic electrode according to a third embodiment of this invention.

The third embodiment of this invention is shown in FIG. 3.

FIG. 3 is a sectional structural view showing an ohmic electrode according to the third embodiment of this invention.

The ohmic electrode of this invention is such that a Si layer 302, a first metal film 303, and a second metal film 304 are formed in order on a nitride semiconductor 301 such as a GaN-based semiconductor. Thereafter, heat treatment is carried out at 500° C. or more. In this manner, the ohmic electrode is formed.

The nitride semiconductor 301 of this embodiment is, for example, a semiconductor containing GaN, AlN, InN, and their mixture as main components.

The first metal film 303 is, for example, a metal film containing one of V, Mo, Ti, Nb, W, Fe, Hf, Re, Ta, and Zr.

The second metal film 304 is, for example, a metal film containing one of V, Mo, Ti, Nb, W, Fe, Hf, Re, Ta, Zr, Pt, and Au, which differs from that of the first metal film 303.

EXAMPLE 3

Description will be made of an Example of the embodiment of this invention.

An ohmic electrode of this invention uses AlGaN (e.g. Al composition ratio 0.3) as a nitride semiconductor 301. Then, a Si layer 302 (e.g. film thickness 3 nm), a Nb layer (e.g. film thickness 30 nm) as a first metal film 303, and an Au layer (e.g. film thickness 200 nm) as a second metal film 304 are electron-gun-deposited and heat treatment at 1000° C. is carried out. In this manner, the ohmic electrode is produced.

With this electrode structure, since the melting point of Nb is 2477° C., the melting point of Pt is 1768° C., which are extremely high, and the melting point of Au is also high as 1064° C., no melting occurs at the heat treatment temperature. Further, alloying is reluctant to proceed, thus being stable. Moreover, since Si serves as an n-type dopant with respect to AlGaN, a further reduction in contact resistance can be achieved. Accordingly, it is possible to realize a low contact resistance of 2 Ωmm or less even if the temperature near the electrode rises to 500° C. during energization.

Although Nb is used as the first metal film 303 in this Example, use may be made, as the first metal film, of a metal film containing one of V, Mo, Ti, W, Fe, Hf, Re, Ta, and Zr, or Si and N may be mixed. However, since there is a metal whose melting point is lowered depending on the mixing ratio of Si, it is preferable that the mixing ratio of Si be set to a value that causes the melting point of an alloy to be 1000° C. or more.

Further, although Au is used as the second metal film 304, it is possible to use therefor a metal film containing one of V, Mo, Ti, Nb, W, Fe, Hf, Re, Ta, Zr, Pt, and Au, which differs from that of the first metal film 303.

Table 3 shows the first metals with one example of their thickness and the second metals with one example of their thickness, which are applicable in Example 3. Further, the melting points of the respective metals are shown under atomic symbols.

TABLE 3

| Si Layer | Thickness (nm) | First Metal | Thickness (nm) | Second Metal | Thickness (nm) |
|---|---|---|---|---|---|
| Si | 3 | V 1915° C. | 30 | V 1915° C. | 200 |
|  |  | Mo 2620° C. | 30 | Mo 2620° C. | 200 |
|  |  | Nb 2458° C. | 30 | Nb 2458° C. | 200 |
|  |  | Ti 1667° C. | 30 | Ti 1667° C. | 200 |
|  |  | W 3407° C. | 30 | W 3407° C. | 200 |
|  |  | Fe 1535° C. | 30 | Fe 1535° C. | 200 |
|  |  | Hf 2222° C. | 30 | Hf 2222° C. | 200 |
|  |  | Re 3180° C. | 30 | Re 3180° C. | 200 |
|  |  | Ta 2980° C. | 30 | Ta 2980° C. | 200 |
|  |  | Zr 1857° C. | 30 | Zr 1857° C. | 200 |
|  |  |  |  | Au 1064° C. | 200 |
|  |  |  |  | Pt 1769° C. | 200 |

In this Example, the thickness of the Si layer 302 is set to 3 nm, the thickness of the Nb layer as the first metal film 303 is set to 30 nm, and the thickness of the Au layer as the second metal film 304 is set to 200 nm. However, the thicknesses of the Si layer, the Nb layer, and the Au layer can be set to desired values. However, in order to prevent Au from directly contacting the semiconductor or Si due to the influence of roughness of the metal interfaces, the thickness of the first metal film (e.g. the Nb layer) is preferably 10 nm or more. On the other hand, when the thickness of the Si layer 302 increases, Si, which was not used as the n-type dopant, remains. Since the resistance value of Si itself is high and therefore, the contact resistance is degraded, the thickness of Si is preferably 5 nm or less.

In this Example, the first and second metal films 303 and 304 are formed by electron-gun deposition. However, it is also possible to stack them in layers by another method such as sputter deposition.

Further, in this Example, the heat treatment temperature is set to 1000° C. However, the heat treatment temperature can be set to a desired value depending upon a metal to be used. However, since the contact resistance tends to decrease as the heat treatment temperature rises, it is preferable to carry out the heat treatment at 800° C. or more.

When further stacking a layer after the heat treatment, a desired metal can be formed to a desired thickness depending on the purpose.

Another Embodiment

In the foregoing second embodiment, no Si layer is formed between the first metal film 202 and the nitride semiconductor 201 (see FIG. 2). However, like in the foregoing third embodiment (see FIG. 3), a Si layer may be formed between the first metal film 202 and the nitride semiconductor 201. In this case, the Si layer serves as an n-type dopant with respect to the nitride semiconductor 201.

INDUSTRIALLY APPLICABLE FIELD

An ohmic electrode of a nitride semiconductor device of this invention can be used in a device using a nitride semiconductor, such as, for example, a light-emitting diode, a laser diode, a Schottky diode, a field-effect transistor, or a bipolar transistor.

The invention claimed is:

1. An ohmic electrode structure of a nitride semiconductor device having a nitride semiconductor, comprising:
   a first metal film formed on the nitride semiconductor, and
   a second metal film formed on the first metal film,
   wherein the first metal film is made of at least one material selected from the group consisting of V, Mo, Ti, Nb, W, Fe, Hf, Re, Ta, and Zr, and
   the second metal film is made of at least one material that is different from that of the first metal film and selected from the group consisting of V, Mo, Ti, Nb, W, Fe, Hf, Re, Ta, Zr, Pt, and Au,
   excluding;
   a combination of V as the first metal film and Pt or Au as the second metal film,
   a combination of Ti as the first metal film and Mo, Pt or Au as the second metal film,
   a combination of W as the first metal film and Pt or Au as the second metal film,
   a combination of Hf as the first metal film and Au as the second metal film, and
   a combination of Zr as the first metal film and Pt or Au as the second metal film.

2. An electrode structure of a nitride semiconductor device according to claim 1, wherein:
   the nitride semiconductor is a semiconductor containing GaN, AlN, InN, and their mixture as main components.

3. An electrode structure of a nitride semiconductor device according to claim 1, wherein:
   a layer in which the material of the first metal film and Si are mixed is formed between the first metal film and the nitride semiconductor.

4. An ohmic electrode structure of a nitride semiconductor device having a nitride semiconductor, comprising:
   a first metal film formed on the nitride semiconductor,
   a second metal film formed on the first metal film, and
   a third metal film formed on the second metal film,
   wherein the first metal film is made of at least one material selected from the group consisting of V, Mo, Ti, Nb, W, Fe, Hf, Re, Ta, and Zr,
   the second metal film is made of at least one material that is different from that of the first metal film and selected from the group consisting of V, Mo, Ti, Nb, W, Fe, Hf, Re, Ta, Zr, Pt, and Au, and
   the third metal film is made of at least one material that is different from that of the second metal film and selected from the group consisting of V, Mo, Ti, Nb, W, Fe, Hf, Re, Ta, Zr, Pt, and Au,
   excluding;
   a combination of V as the first metal film and Pt or Au as the second metal film,
   a combination of Ti as the first metal film and Mo, Pt or Au as the second metal film,
   a combination of W as the first metal film and Pt or Au as the second metal film,
   a combination of Hf as the first metal film and Au as the second metal film, a combination of Zr as the first metal film and Pt or Au as the second metal film, and a combination of Ti as the first metal film, Pt as the second metal film, and Au as the third metal film.

5. An electrode structure of a nitride semiconductor device according to claim 4, wherein:

the nitride semiconductor is a semiconductor containing GaN, AlN, InN, and their mixture as main components.

6. An electrode structure of a nitride semiconductor device according to claim 4, wherein:

a layer in which the material of the first metal film and Si are mixed is formed between the first metal film and the nitride semiconductor.

* * * * *